United States Patent
Li et al.

(10) Patent No.: US 12,431,338 B2
(45) Date of Patent: Sep. 30, 2025

(54) COMPOSITE STRUCTURES FOR SEMICONDUCTOR PROCESS CHAMBERS

(71) Applicant: Applied Materials, Inc., Santa Clara, CA (US)

(72) Inventors: Tianshu Li, Santa Clara, CA (US); Yikai Chen, Santa Clara, CA (US); Aniruddha Pal, Santa Clara, CA (US); Yao-Hung Yang, Santa Clara, CA (US); Saurabh M. Chaudhari, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 18/386,721

(22) Filed: Nov. 3, 2023

(65) Prior Publication Data

US 2025/0149305 A1    May 8, 2025

(51) Int. Cl.
*H01J 37/32* (2006.01)
*C23C 16/32* (2006.01)

(52) U.S. Cl.
CPC ...... *H01J 37/32642* (2013.01); *C23C 16/325* (2013.01); *H01J 37/32477* (2013.01)

(58) Field of Classification Search
CPC .......... H01J 37/32642; H01J 37/32477; C23C 16/325
See application file for complete search history.

(56) References Cited

U.S. PATENT DOCUMENTS

| | | | |
|---|---|---|---|
| 7,338,578 B2 | 3/2008 | Huang et al. | |
| 7,829,183 B2 | 11/2010 | Forrest et al. | |
| 8,011,319 B2 | 9/2011 | Chung et al. | |
| 9,741,600 B2 | 8/2017 | Hsieh et al. | |
| 2012/0220107 A1* | 8/2012 | Fukuda | H01L 21/67757 118/728 |
| 2015/0090897 A1 | 4/2015 | Mason et al. | |
| 2022/0002863 A1 | 1/2022 | Xu et al. | |
| 2022/0130688 A1 | 4/2022 | Kalita | |
| 2023/0051800 A1* | 2/2023 | Chen | C04B 35/117 |
| 2023/0290616 A1 | 9/2023 | Kalita et al. | |

OTHER PUBLICATIONS

International Search Report for PCT/US2024/053827, dated Feb. 14, 2025.

* cited by examiner

*Primary Examiner* — Michael G Miller
(74) *Attorney, Agent, or Firm* — Moser Taboada

(57) ABSTRACT

A method for forming a part for a process chamber incorporates a substrate core in the part. The method may include performing a silicon carbide (SIC) deposition process on a substrate to form a SiC coating of approximately 1 mm to approximately 2 mm on all sides of the substrate to form a composite SiC structure where the substrate is composed of a stack of a plurality of substrates each with a thickness of approximately 1 mm to approximately 2 mm and separating the stack of the plurality of substrates of the composite SiC structure to form multiple composite structures where each multiple composite structure has an SiC coating on a top surface and on all side surfaces and a bottom surface of exposed substrate material.

16 Claims, 3 Drawing Sheets

COMPOSITE STRUCTURES FOR SEMICONDUCTOR PROCESS CHAMBERS

FIELD

Embodiments of the present principles generally relate to semiconductor processing of semiconductor substrates.

BACKGROUND

During the manufacturing of semiconductor devices, plasma may be used to deposit materials on and to etch materials from a substrate in a process chamber. The plasma creates a harsh environment in the chamber that can erode parts of a process kit that protects the chamber from the plasma. Some components of the process kit help to control the plasma sheath in order to increase performance of the chamber processes. In some cases, silicon carbide may be used to manufacture parts of the chamber to reduce wear and to help maintain the performance of the processes. The inventors, however, have observed that components manufactured of silicon carbide have high manufacturing costs due to the raw materials involved in manufacturing and the manufacturing low throughput caused by long silicon carbide deposition processes.

Accordingly, the inventors have provided methods for increasing manufacturing throughput of silicon carbide parts and reducing the manufacturing costs associated with the silicon carbide parts.

SUMMARY

Methods for manufacturing silicon carbide parts that increase manufacturing throughput and reduce manufacturing costs are provided herein.

In some embodiments, a method for forming a part for a process chamber may comprise performing a silicon carbide (SiC) deposition process on a substrate to form a SiC coating on all sides of the substrate to form a composite SiC structure and forming at least one part for the process chamber from the composite SiC structure, wherein each part of the at least one part retains at least a portion of the substrate.

In some embodiments, the method may further comprise forming at least one part for the process chamber from the multiple composite SiC structures where each part of the at least one part retains at least a portion of the substrate, at least one part that is an edge ring for a plasma chamber, each of the multiple composite structures has a thickness of at least 50% substrate material, each substrate of the stack of the plurality of substrates has a thickness of approximately 1 mm to approximately 2.5 mm, each substrate of the stack of the plurality of substrates is graphite, oxide ceramics, or silicon with a purity of 99.99% or greater, a SiC coating that has a thickness of approximately 1 mm to approximately 2 mm on all sides of the substrate, each substrate of the stack of the plurality of substrates has an annular shape, a SiC deposition process that is performed at approximate 1200 degrees Celsius to approximately 1400 degrees Celsius, and/or a stack of a plurality of substrates that is separated using a diamond cutting process to cut through the SiC coating on the side surfaces.

In some embodiments, an edge ring for a process chamber may comprise a substrate with a substrate material of graphite, oxide ceramic, or silicon with a purity of 99.99% or greater, wherein the substrate has an annular shape and a silicon carbide (SiC) coating on a top surface, an outer diameter surface, and an inner diameter surface of the substrate and wherein a bottom surface of the substrate is exposed substrate material.

In some embodiments, the edge ring may also include an edge ring that has a thickness of at least 50% substrate material, a substrate that has a thickness of approximately 1 mm to approximately 2.5 mm, and/or an SiC coating that has a thickness on the top surface, the outer diameter surface, and the inner diameter surface of approximately 1 mm to approximately 2 mm on all sides of the substrate.

In some embodiments, a non-transitory, computer readable medium having instructions stored thereon that, when executed, cause a method forming a part for a process chamber to be performed, the method may comprise performing a silicon carbide (SiC) deposition process on a substrate to form a SiC coating on all sides of the substrate to form a composite SiC structure where the substrate is composed of a stack of a plurality of substrates and separating the stack of the plurality of substrates of the composite SiC structure to form multiple composite structures, each multiple composite structure has SiC coating on a top surface and on all side surfaces and a bottom surface of exposed substrate material.

In some embodiments, the method of the non-transitory, computer readable medium may further include processing each of the multiple composite structures to form multiple parts used in a plasma chamber where at least one of the multiple composite structures is processed into an edge ring for a plasma chamber, each substrate of a stack of a plurality of substrates that is graphite, oxide ceramics, or silicon with a purity of 99.99% or greater, each substrate of a stack of a plurality of substrates that has an annular shape, an SiC deposition process that is performed at approximate 1200 degrees Celsius to approximately 1400 degrees Celsius, each substrate of a stack of a plurality of substrates that has a thickness of approximately 1 mm to approximately 2.5 mm, and/or an SiC coating that has a thickness of approximately 1 mm to approximately 2 mm on all sides of the substrate.

Other and further embodiments are disclosed below.

BRIEF DESCRIPTION OF THE DRAWINGS

Embodiments of the present principles, briefly summarized above and discussed in greater detail below, can be understood by reference to the illustrative embodiments of the principles depicted in the appended drawings. However, the appended drawings illustrate only typical embodiments of the principles and are thus not to be considered limiting of scope, for the principles may admit to other equally effective embodiments.

Figure 1:
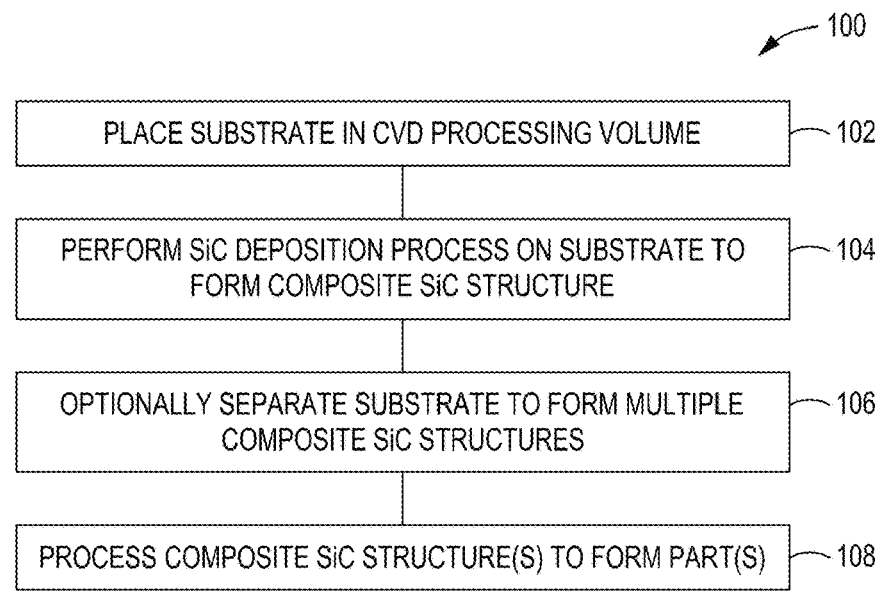
FIG. 1 is a method for forming a part for a process chamber in accordance with some embodiments of the present principles.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

The methods provide improved manufacturing processes for silicon carbide (SiC) parts used in semiconductor process chambers. The methods increase manufacturing throughput while simultaneously lowering manufacturing costs without the loss of performance. A core or substrate of non-SiC material is used to substantially reduce the chemical vapor deposition (CVD) time for SiC material used in a SiC chamber part. The SiC deposited material on the non-SiC material allows for a thinner layer of SiC on the chamber part, saving deposition time (increasing throughput) and reducing raw material usage (reducing part costs).

Traditional bulk CVD SiC parts require long deposition times which causes low throughput and high manufacturing costs of SiC parts. SiC materials are highly desirable in harsh plasma environments as other low-cost refractory materials do not provide as strong a chemical and plasma etching resistance as CVD SiC materials. The techniques of the present principles provide methods of manufacturing composite SiC parts using CVD deposition. The present methods integrate a CVD growth substrate as part of the final product to reduce the deposition time of CVD SiC and to improve the product cost. The methods can be utilized, for example, for various etch chamber parts such as, but not limited to, edge rings and the like. The CVD SiC surfaces on the substrate provide excellent etching resistance, while the core substrate lowers the manufacturing cost of the part. The thickness ratio of the SiC layer and the substrate can also be tuned to satisfy different mean time between cleans (MTBC) requirements for different users or processes of the chambers.

The present methods integrate the substrate as part of the final product. For the substrate preparation phase, proper substrate material is processed by machining and purifying to the desired dimensions. The substrate materials should have relatively low manufacturing costs and introduce low contamination to the process chamber. Contamination as used herein refers to the materials of the substrate interfering with the performance of the chamber due to the material interacting with other materials of the chamber or materials introduced by the processes. In some embodiments, the substrate material may include oxide ceramics, silicon, graphite, and the like that are processed to provide the desirable characteristics. After preparation, the substrate is then put in a CVD reactor chamber for thermal SiC deposition. Compared to previous bulk SiC growth (for example a part with approximately 5 mm to approximately 6 mm of SiC thickness needed), the SiC deposition of the present methods, in some embodiments, is only approximately 1 mm to approximately 2 mm in SiC thickness. The reduced SiC thickness of the present methods still provides enough potential erosion depth between preventive maintenance (PM) sessions for etch chambers. In some embodiments, the formation process of the part may include a stack of a plurality of substrates which are coated with SiC and then separated to form multiple composite SiC parts.

Figure 3:
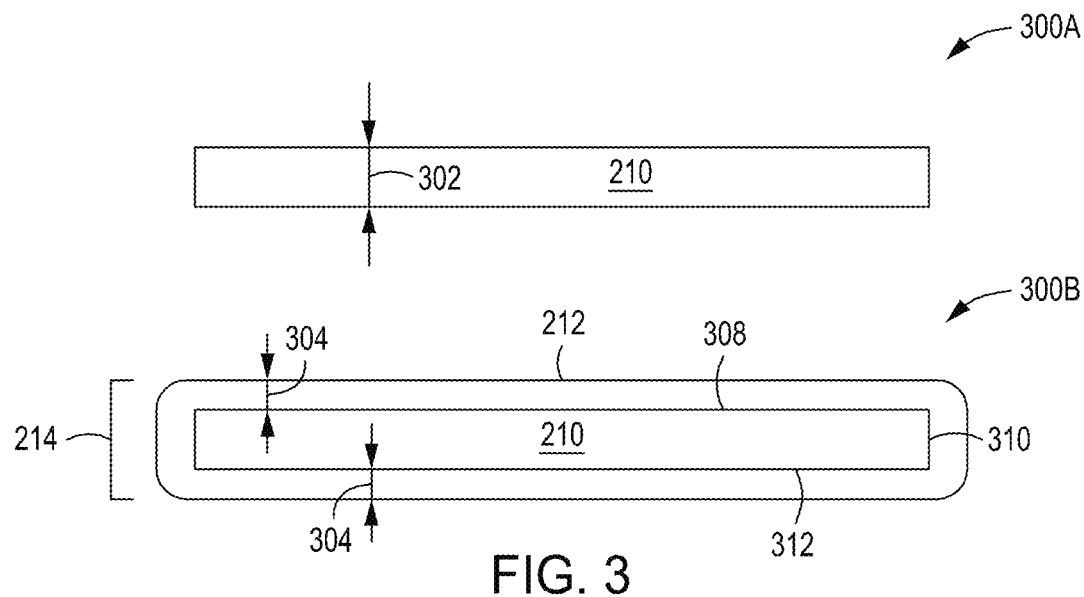
FIG. 3 depicts a cross-sectional view of a substrate and a composite silicon carbide (SiC) structure in accordance with some embodiments of the present principles.
Figure 4:
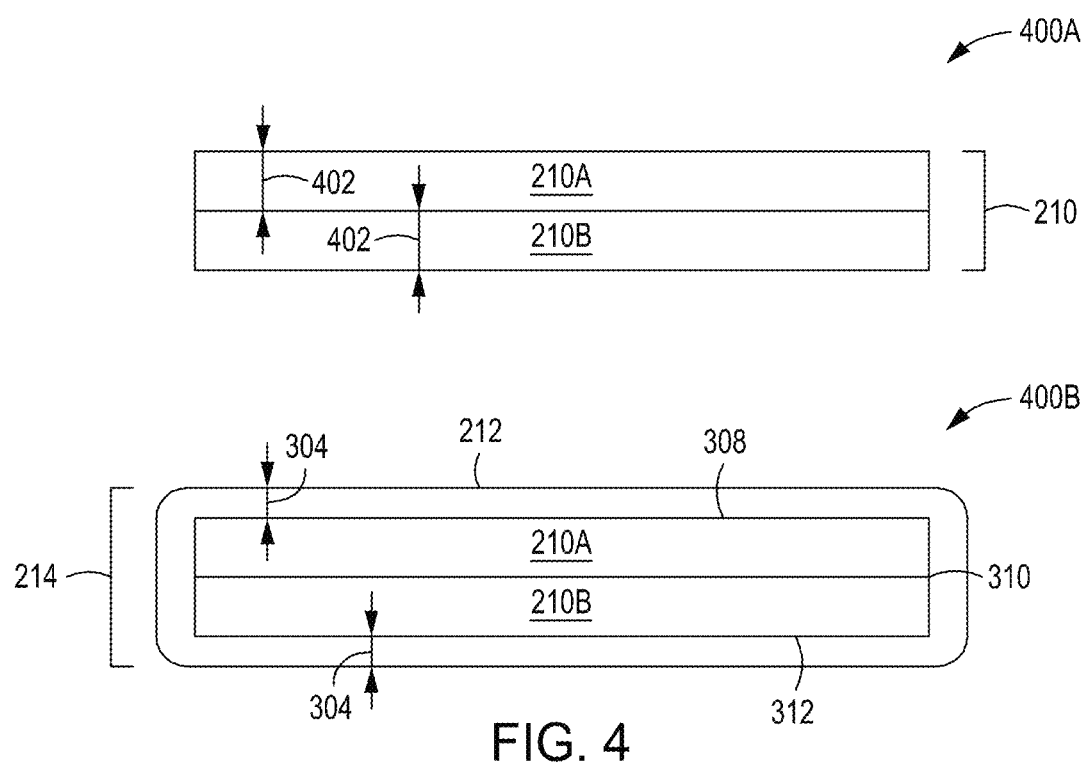
FIG. 4 depicts a cross-sectional view of a substrate composed of a stack of a plurality of substrates and a composite SiC structure in accordance with some embodiments of the present principles.

FIG. 1 is a method 100 for forming a part for a process chamber. In block 102, a substrate 210 is placed in a CVD processing volume 208 of a CVD chamber 202 as depicted in a view 200 of FIG. 2. In some embodiments, the substrate 210 is a single substrate as depicted in a view 300A of FIG. 3. In some embodiments, the substrate 210 is a stack of a plurality of substrates as depicted in a view 400A of FIG. 4. The substrate 210 may be composed of material that is processed to have characteristics that provide sufficient strength for use in the chamber part being formed by the method 100, offers good surfaces for SiC CVD growth with high SiC purity, and can endure SiC deposition temperatures of approximately 1200 degrees Celsius to 1400 degrees Celsius and the like. In some embodiments, materials such as graphite, oxide ceramics such as, but not limited to, aluminum oxide, and/or silicon with high purity such as 99.99% purity or greater and the like may be used as the substrate material after processing to meet the desired characteristics.

Figure 6:
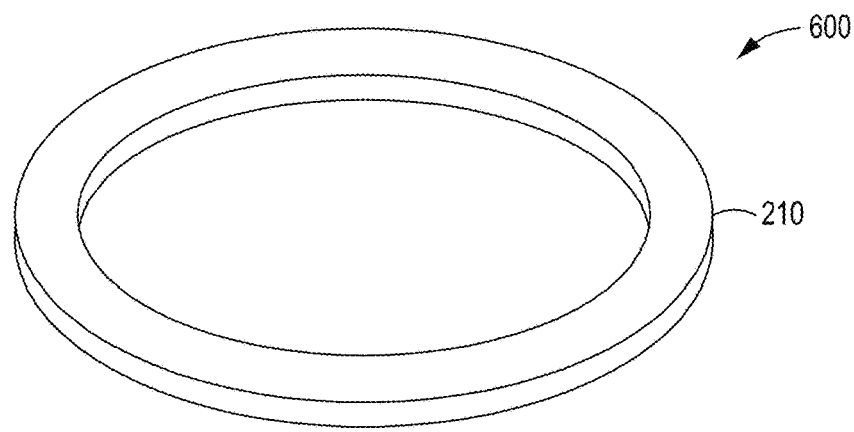
FIG. 6 depicts a cross-sectional view of a substrate with an annular shape in accordance with some embodiments of the present principles.
Figure 7:
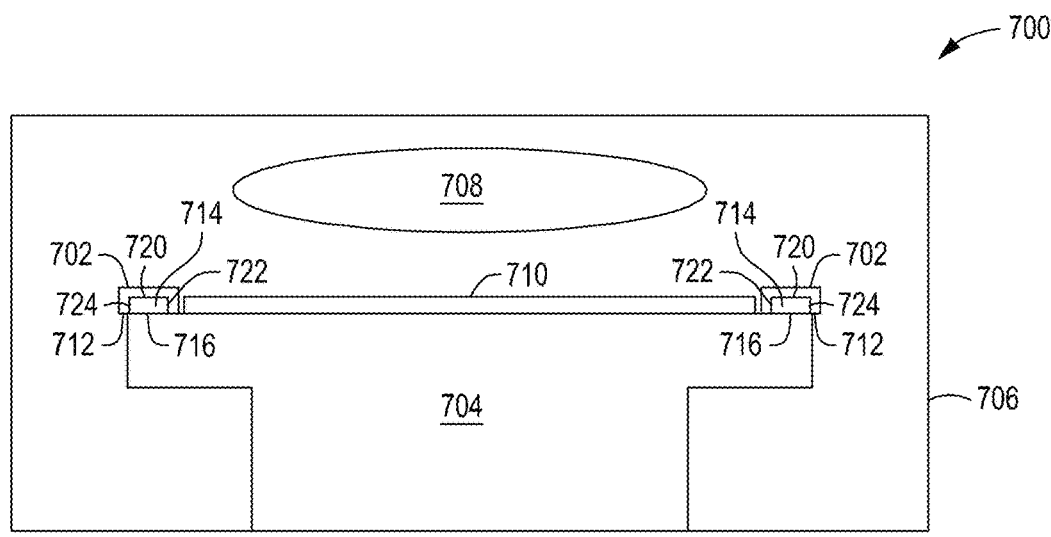
FIG. 7 depicts a cross-sectional view of a plasma chamber with an edge ring in accordance with some embodiments of the present principles.

Materials such as oxide ceramics and silicon have a reduced cost over graphite and may be used instead to lower the overall part formation costs. In some embodiments, the substrate 210 may have a thickness 302 of approximately 1 mm to approximately 2.5 mm as depicted in the view 300A of FIG. 3. In some embodiments, each substrate 210A, 210B of a stack of a plurality of substrates may have a thickness 402 of approximately 1 mm to approximately 2.5 mm as depicted in the view 400A of FIG. 4. In some embodiments, the substrate 210 may have a ring or annular shape as depicted in a view 600 of FIG. 6. The annular shaped substrate may be used, for example, to form an edge ring 702 that surrounds a substrate 710 undergoing a process on a substrate support 704 in a plasma chamber 706 to facilitate in controlling the plasma sheath 708 at the edges of the substrate 710 as depicted in a view 700 of FIG. 7. An SiC coating 712, discussed below, is formed on a top surface 720 of the substrate 714, on an inner diameter surface 722 of the substrate 714, and on an outer diameter surface 724 of the substrate 714. A bottom surface 716 of the edge ring 702 is exposed substrate material (see FIG. 7).

Figure 2:
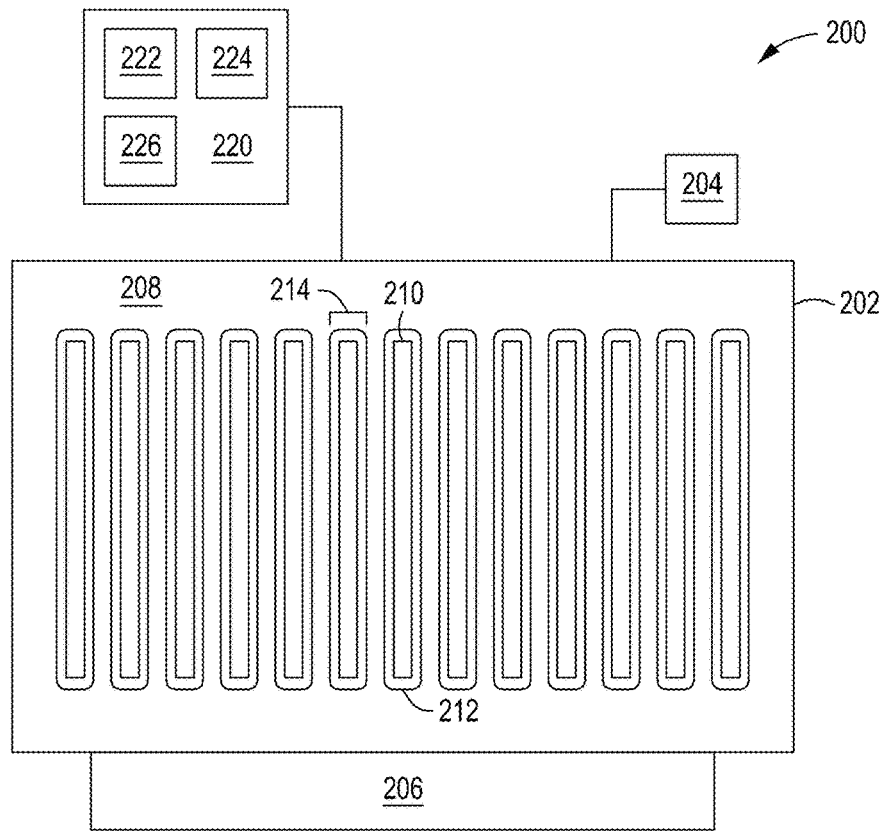
FIG. 2 depicts a cross-sectional view of a chemical vapor deposition (CVD) chamber in accordance with some embodiments of the present principles.

The CVD chamber 202 of FIG. 2 in some instances may also include a heating element 206 which may be positioned anywhere within or around the CVD chamber 202. One or more gas supplies 204 provide precursors and/or process gases into the CVD chamber 202 for CVD deposition. The CVD chamber 202 may also include a system controller 220 that controls the operation of the CVD chamber 202 using a direct control or alternatively, by controlling the computers (or controllers) associated with the CVD chamber 202. In operation, the system controller 220 enables data collection and feedback from the CVD chamber 202 to optimize performance of the CVD chamber 202. The system controller 220 generally includes a Central Processing Unit (CPU) 222, a memory 224, and a support circuit 226. The CPU 222 may be any form of a general-purpose computer processor that can be used in an industrial setting. The support circuit 226 is conventionally coupled to the CPU 222 and may comprise a cache, clock circuits, input/output subsystems, power supplies, and the like. Software routines, such as a method as described above may be stored in the memory 224 and, when executed by the CPU 222, transform the CPU 222 into a specific purpose computer (system controller 220). The software routines may also be stored and/or executed by a second controller (not shown) that is located remotely from the CVD chamber 202.

The memory 224 is in the form of computer-readable storage media that contains instructions, when executed by the CPU 222, to facilitate the operation of the semiconductor processes and equipment. The instructions in the memory 224 are in the form of a program product such as a program that implements the methods of the present principles. The program code may conform to any one of a number of different programming languages. In one example, the disclosure may be implemented as a program product stored on a computer-readable storage media for use with a computer system. The program(s) of the program product define functions of the aspects (including the methods described herein). Illustrative computer-readable storage media include, but are not limited to: non-writable storage media (e.g., read-only memory devices within a computer such as CD-ROM disks readable by a CD-ROM drive, flash memory, ROM chips, or any type of solid-state non-volatile semiconductor memory) on which information is permanently stored; and writable storage media (e.g., floppy disks within a diskette drive or hard-disk drive or any type of solid-state random access semiconductor memory) on which alterable information is stored. Such computer-readable storage media, when carrying computer-readable instructions that direct the functions of the methods described herein, are aspects of the present principles.

In block 104 of FIG. 1, a CVD deposition process is performed to deposit a SiC coating 212 on the substrate 210 to form a SiC structure 214 as depicted in FIG. 2. The SiC coating 212 has a thickness 304 of approximately 1 mm to approximately 2 mm on all surfaces of the substrate 210 including a top surface 308, a bottom surface 312 and sides 310 as depicted in a view 300B of FIG. 3 for a single substrate and as depicted in a view 400B of FIG. 4 for a stack of a plurality of substrates. The CVD deposition rate of SiC is very low and may be, for example, in the range of only 50 microns per hour (20 hours per mm). In traditional processes with a SiC thickness of 3 mm to 5 mm, the deposition time can take from 60 hours to 100 hours or more. The methods of the present principles substantially reduces the deposition time down to 20 hours to 40 hours or less, greatly increasing manufacturing throughput by up to 5 times or more. Increased throughput also means decreased production costs. Use of less raw materials also decreases production costs. With both higher throughput and reduced raw material usage, the present methods provide a substantial cost reduction for traditional processes. In addition, as discussed below, time consuming cutting and grinding processes can be eliminated, saving additional costs and time.

The composite structure 214 can be adjusted based on the use of the part being formed. For example, the composite structure 214 may be constructed of 50% substrate thickness and 50% SiC coating thickness. If a greater erosion protection is desired, the SiC coating thickness may be increased beyond 50% of the total thickness of the composite structure 214. If greater strength is desired, the substrate thickness may be increased beyond 50% of the total thickness of the composite structure 214. The present methods allow the flexibility during formation of the composite structure 214 to account for the use of the part and also to adjust the cost of the part by altering thicknesses of the substrate and the SiC coating. In general terms, the thickness of the substrate should be enough to maintain structural integrity (not being too thin such as to cause cracking or breaking during handling), but not so thick such that the cost of the final part is increased unnecessarily.

Figure 5:
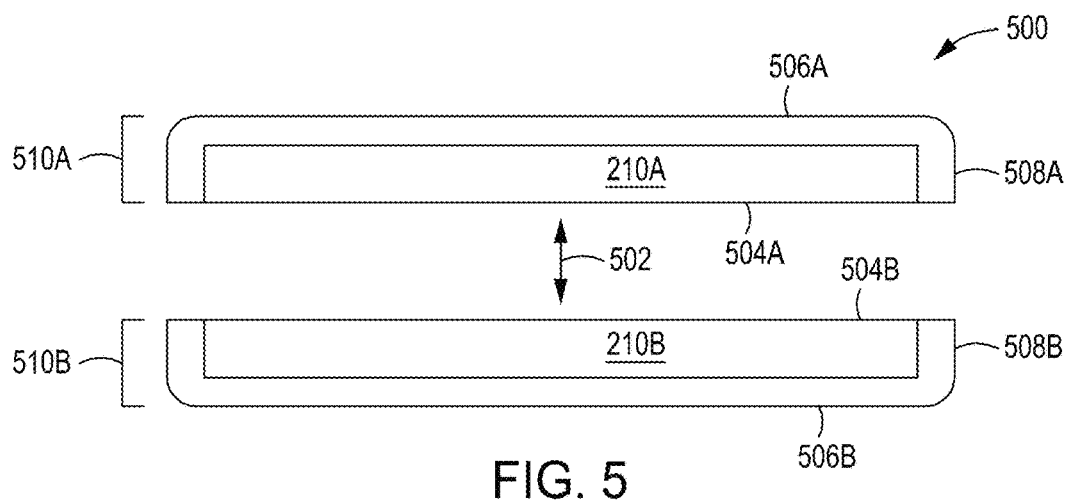
FIG. 5 depicts a cross-sectional view of a composite SiC structure composed of a stack of a plurality of substrates being separated to form multiple composite SiC structures in accordance with some embodiments of the present principles.

In block 106, optionally, the substrate 210, when composed of a stack of a plurality of substrates 210A, 210B (see view 400B of FIG. 4), can be separated 502 to form multiple composite SiC structures 510A, 510B, as depicted in a view 500 of FIG. 5. The use of a substrate 210 composed of a stack of a plurality of substrates increases the manufacturing efficiency as the final composite SiC structure yields multiple composite SiC structures 510A, 510B that can be processed to form multiple parts. Each of the multiple composite SiC structures 510A, 510B has SiC coating on a top surface 506A, 506B and on all side surfaces 508A, 508B, and a bottom surface 504A, 504B of exposed substrate material. In some embodiments, a stack of a plurality of substrates coated with SiC can be separated by cutting through the SiC coating on the sides of the substrates with a diamond cutting process to separate each of the substrates of the stack. Other separation techniques can be used as well. As discussed above, the substrate material is selected to prevent contact and environment contamination and exposure of the substrate material does not affect plasma chamber environments or plasma processes.

In block 108, the composite SiC structure or structures are then processed to form a part or parts. The processing may include machining and other processes to alter the shape of the SiC structure so that the final part conforms to a particular location or use within a plasma chamber. With the present methods, diamond cutting processes can be minimized or completely avoided, saving time and costs compared to the traditional processes. In addition, traditional processes require the grinding off of the substrate material used to form the SiC structure. The present methods do not require the removal of the substrate material (the substrate material becomes part of the composite SiC structure) and, therefore, saves additional time and costs in processing the composite SiC structures into the final part over traditional processes.

Embodiments in accordance with the present principles may be implemented in hardware, firmware, software, or any combination thereof. Embodiments may also be implemented as instructions stored using one or more computer readable media, which may be read and executed by one or more processors. A computer readable medium may include any mechanism for storing or transmitting information in a form readable by a machine (e.g., a computing platform or a "virtual machine" running on one or more computing platforms). For example, a computer readable medium may include any suitable form of volatile or non-volatile memory. In some embodiments, the computer readable media may include a non-transitory computer readable medium.

While the foregoing is directed to embodiments of the present principles, other and further embodiments of the principles may be devised without departing from the basic scope thereof.

The invention claimed is:

1. A method for forming a part for a process chamber, comprising:
   performing a silicon carbide (SiC) deposition process on a substrate to form a SiC coating on all sides of the substrate to form a composite SiC structure, wherein the substrate is composed of a stack of a plurality of substrates; and
   separating the stack of the plurality of substrates of the composite SiC structure to form multiple composite structures, wherein each of the multiple composite structures has the SiC coating on a top surface and on side surfaces and has a bottom surface of exposed substrate material.

2. The method of claim 1, further comprising:
forming at least one part for the process chamber from the multiple composite structures, wherein each part of the at least one part retains at least a portion of the substrate.

3. The method of claim 2, wherein the at least one part is an edge ring for a plasma chamber.

4. The method of claim 1, wherein each of the multiple composite structures has a thickness of at least 50% substrate material.

5. The method of claim 1, wherein each substrate of the stack of the plurality of substrates has a thickness of approximately 1 mm to approximately 2.5 mm.

6. The method of claim 1, wherein each substrate of the stack of the plurality of substrates is graphite, oxide ceramics, or silicon with a purity of 99.99% or greater.

7. The method of claim 1, wherein the SiC coating has a thickness of approximately 1 mm to approximately 2 mm on all sides of the substrate.

8. The method of claim 1, wherein each substrate of the stack of the plurality of substrates has an annular shape.

9. The method of claim 1, wherein the SiC deposition process is performed at approximately 1200 degrees Celsius to approximately 1400 degrees Celsius.

10. The method of claim 1, wherein the stack of the plurality of substrates is separated using a diamond cutting process to cut through the SiC coating on the side surfaces.

11. A non-transitory, computer readable medium having instructions stored thereon that, when executed, cause a method forming a part for a process chamber to be performed, the method comprising:

performing a silicon carbide (SiC) deposition process on a substrate to form a SiC coating on all sides of the substrate to form a composite SiC structure, wherein the substrate is composed of a stack of a plurality of substrates; and separating the stack of the plurality of substrates of the composite SiC structure to form multiple composite structures, each multiple composite structure has the SiC coating on a top surface and on side surfaces and has a bottom surface of exposed substrate material.

12. The non-transitory, computer readable medium of claim 11, the method further comprising:
processing each of the multiple composite structures to form multiple parts used in a plasma chamber, wherein at least one of the multiple composite structures is processed into an edge ring for a plasma chamber.

13. The non-transitory, computer readable medium of claim 11, wherein each substrate of the stack of the plurality of substrates is graphite, oxide ceramics, or silicon with a purity of 99.99% or greater.

14. The non-transitory, computer readable medium of claim 11, wherein each substrate of the stack of the plurality of substrates has an annular shape.

15. The non-transitory, computer readable medium of claim 11, wherein the SiC deposition process is performed at approximate 1200 degrees Celsius to approximately 1400 degrees Celsius.

16. The non-transitory, computer readable medium of claim 11, wherein each substrate of the stack of the plurality of substrates has a thickness of approximately 1 mm to approximately 2.5 mm or wherein the SiC coating has a thickness of approximately 1 mm to approximately 2 mm on all sides of the substrate.

* * * * *